United States Patent [19]
Ilderem et al.

[11] Patent Number: 5,231,042
[45] Date of Patent: Jul. 27, 1993

[54] FORMATION OF SILICIDE CONTACTS USING A SIDEWALL OXIDE PROCESS

[75] Inventors: Vida Ilderem; Alan G. Solheim; Rick C Jerome, all of Puyallup, Wash.

[73] Assignee: National Semiconductor Corporation, Santa Clara, Calif.

[21] Appl. No.: 835,653

[22] Filed: Feb. 13, 1992

Related U.S. Application Data

[62] Division of Ser. No. 503,336, Apr. 2, 1990, Pat. No. 5,107,321.

[51] Int. Cl.$^5$ .................... H01L 21/44; H01L 21/265
[52] U.S. Cl. ..................................... 437/44; 437/200; 437/245; 148/DIG. 147
[58] Field of Search ................. 437/200, 44, 245; 148/DIG. 147

[56] References Cited

U.S. PATENT DOCUMENTS

| | | | |
|---|---|---|---|
| 3,955,269 | 5/1976 | Magdo et al. | 29/577 |
| 4,374,700 | 2/1983 | Scott et al. | 156/656 |
| 4,484,388 | 11/1984 | Iwasaki | 29/571 |
| 4,507,847 | 4/1985 | Sullivan | 29/576 B |
| 4,536,945 | 8/1985 | Gray et al. | 29/571 |
| 4,558,507 | 12/1985 | Okabayashi et al. | 29/571 |
| 4,609,568 | 9/1986 | Koh et al. | 427/85 |
| 4,764,480 | 8/1988 | Vora | 437/54 |
| 4,784,971 | 11/1988 | Chiu et al. | 357/59 H |
| 4,808,548 | 2/1989 | Thomas et al. | 437/200 X |
| 4,810,666 | 3/1989 | Taji | 357/23.9 |
| 4,877,755 | 10/1989 | Rodder | 437/200 |
| 4,927,775 | 5/1990 | Alvarez et al. | 437/31 |
| 4,927,776 | 5/1990 | Soejima | 437/33 |
| 4,929,992 | 5/1990 | Thomas et al. | 357/23.9 |
| 4,960,726 | 10/1990 | Lechaton et al. | 437/59 |
| 4,965,220 | 10/1990 | Iwasaki | 437/59 |
| 5,001,081 | 3/1991 | Tuntasood et al. | 437/59 |
| 5,021,354 | 6/1991 | Pfiester | 437/34 |
| 5,045,483 | 9/1991 | DeLong et al. | 437/31 |

FOREIGN PATENT DOCUMENTS

| | | |
|---|---|---|
| 0197531 | 10/1986 | European Pat. Off. . |
| 0200603 | 11/1986 | European Pat. Off. . |
| WO86/07491 | 12/1986 | PCT Int'l Appl. . |
| WO89/11733 | 11/1989 | PCT Int'l Appl. . |
| 2151847 | 7/1985 | United Kingdom . |

OTHER PUBLICATIONS

Brassington et al., *IEEE Trans. Elect. Devices* (1989) pp. 712-719.
Momose et al., *IEDM Transactions* (Feb. 1985) p. 217.
Kapoor et al., "A High Speed High Density . . . for Linear/Digital Applications," 1985 Custom Integrated Circuits Conference.
Gomi et al., *IEDM Technical Digest* (1988) pp. 744-747.
Haken et al., "BiCMOS Process Technology," *BiCMOS Technology and Applications* (1989) pp. 63-124.
Ghandhi, *VLSI Fabrication Principles, Silicon and Gallium Arsenide*, John Wiley & Sons, New York, 1983, pp. 383-384.
Irene et al., *J. Electrochem. Soc.: Solid-State Science and Technology*, Jul. 1978, pp. 1146-1151.
Ghandhi, *VLSI Fabrication Principles, Silicon and Gallium Arsenide*, John Wiley & Sons, New York, 1983, pp. 493-494.
Berger et al., "Method of Producing Transistors with Optimum Base Contact," *IBM Tech. Discl. Bull.* (1980) 23:1487-1488.

*Primary Examiner*—John S. Maples
*Attorney, Agent, or Firm*—Townsend and Townsend Khourie and Crew

[57] ABSTRACT

A method for formation of silicide structures on a semiconductor device. Oxide sidewalls are formed upon and selectively removed from polysilicon contacts. Refractory metal is deposited and heated, unreacted metal is removed, leaving a metal silicide on selected polysilicon sidewalls.

6 Claims, 10 Drawing Sheets

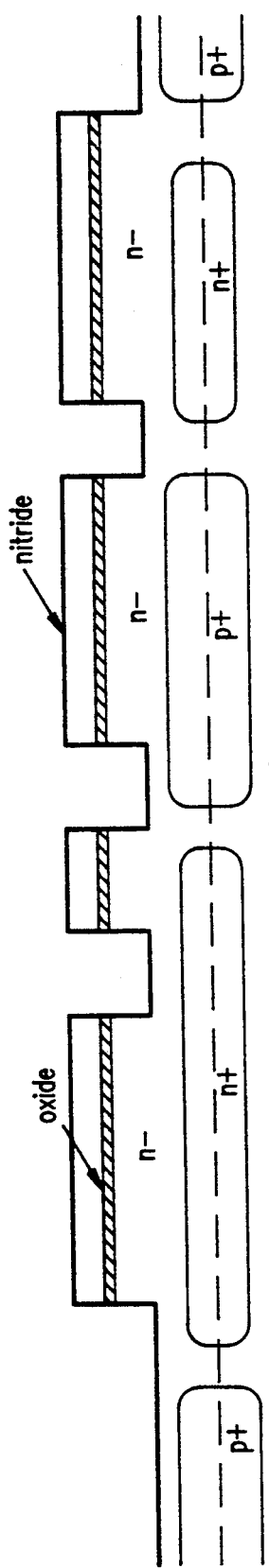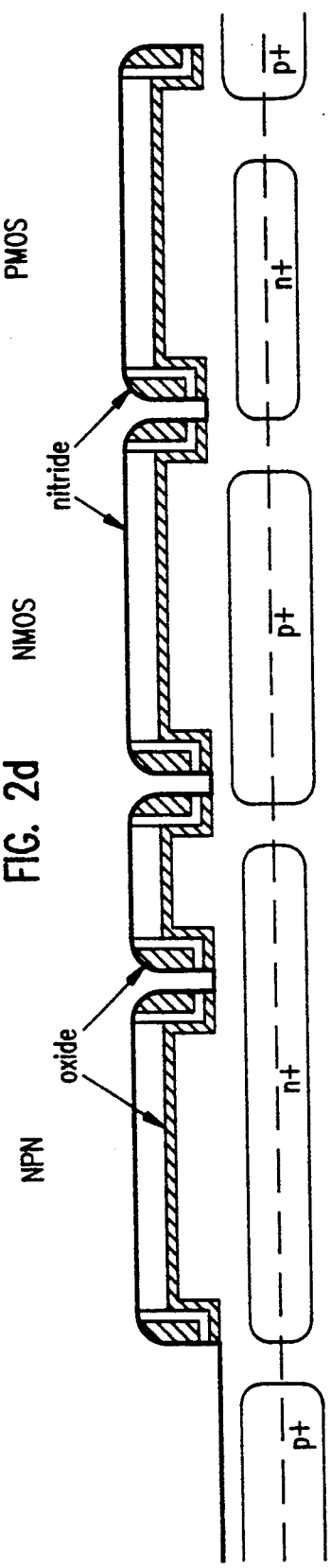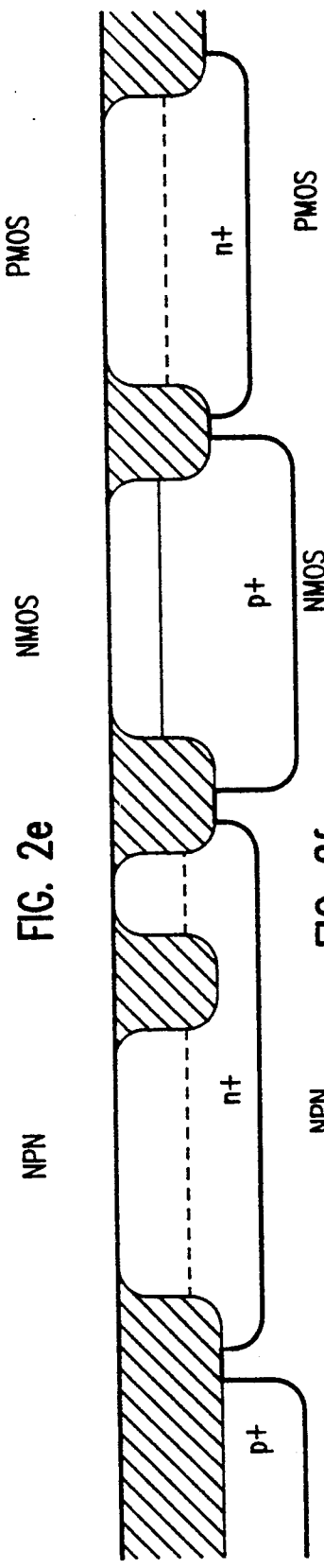

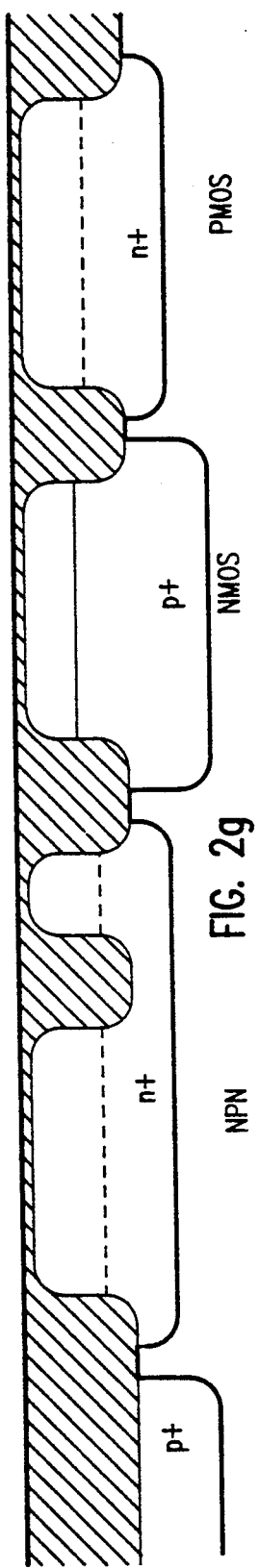
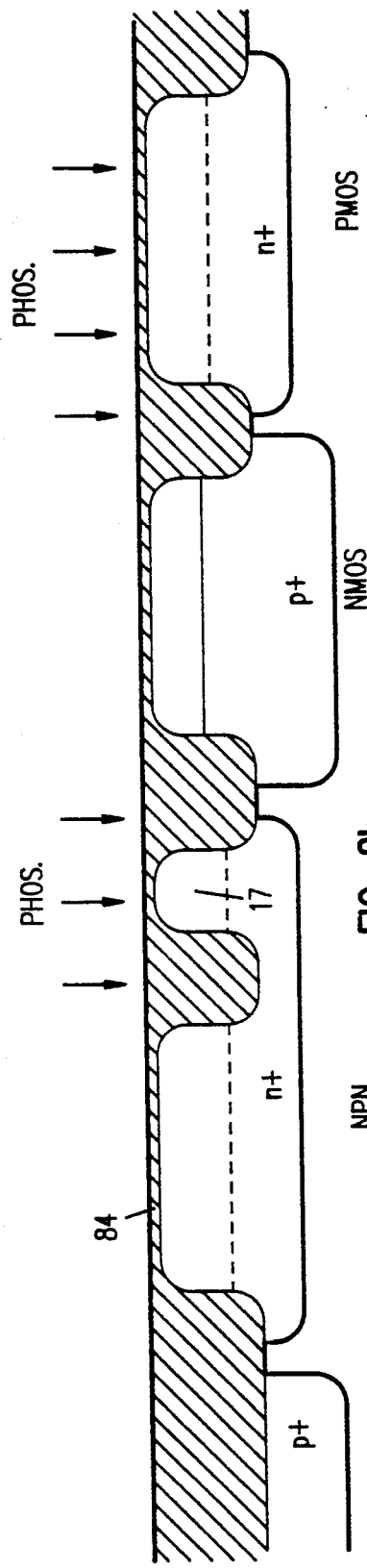
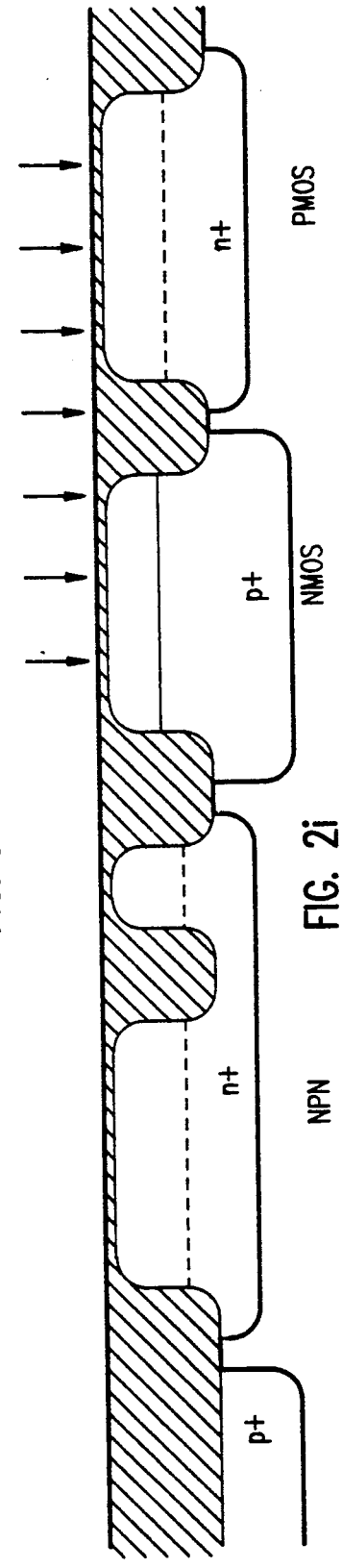

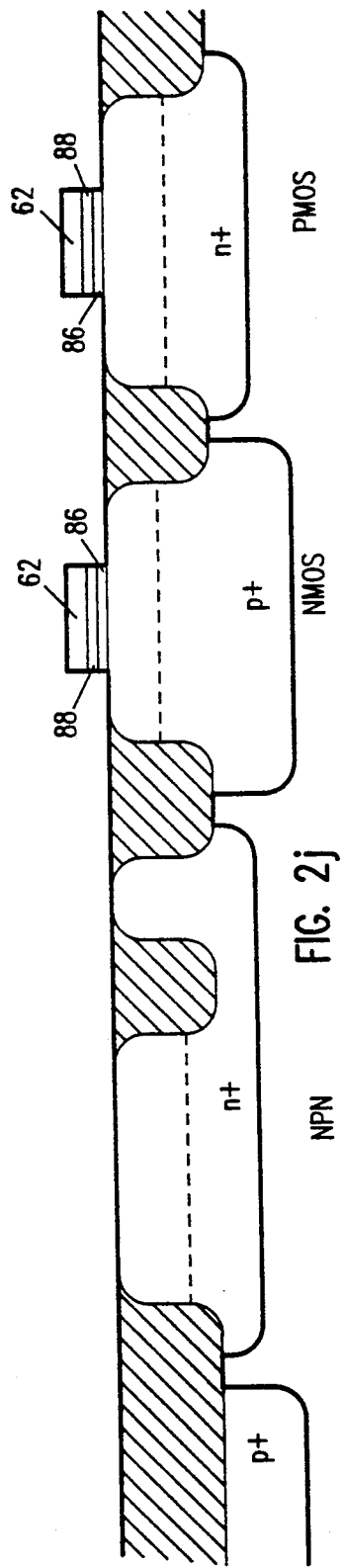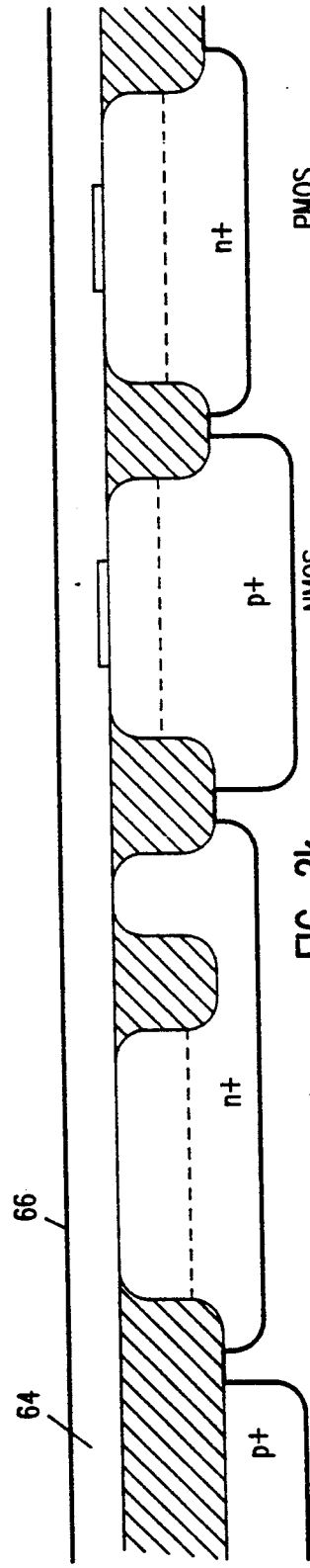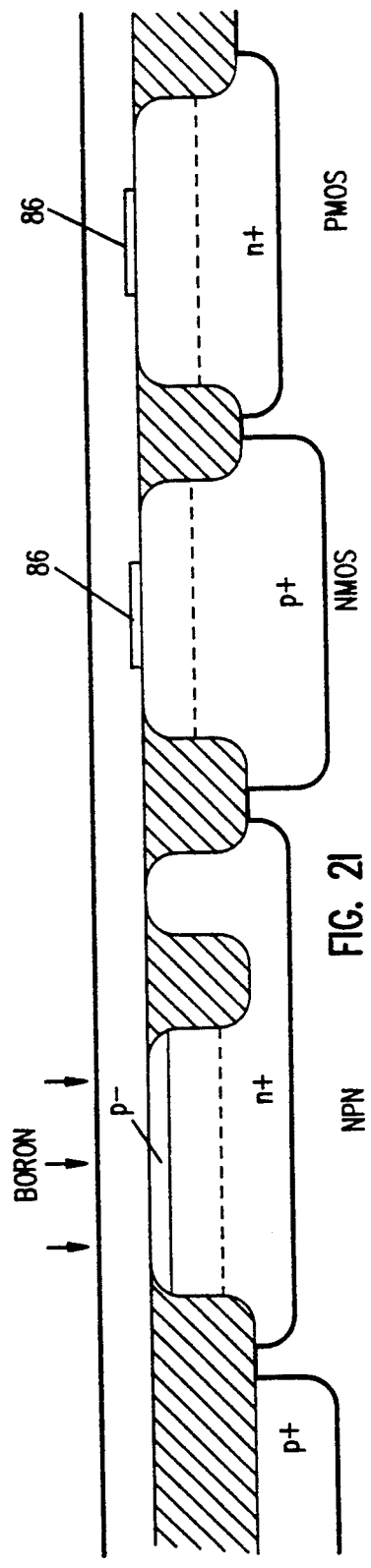

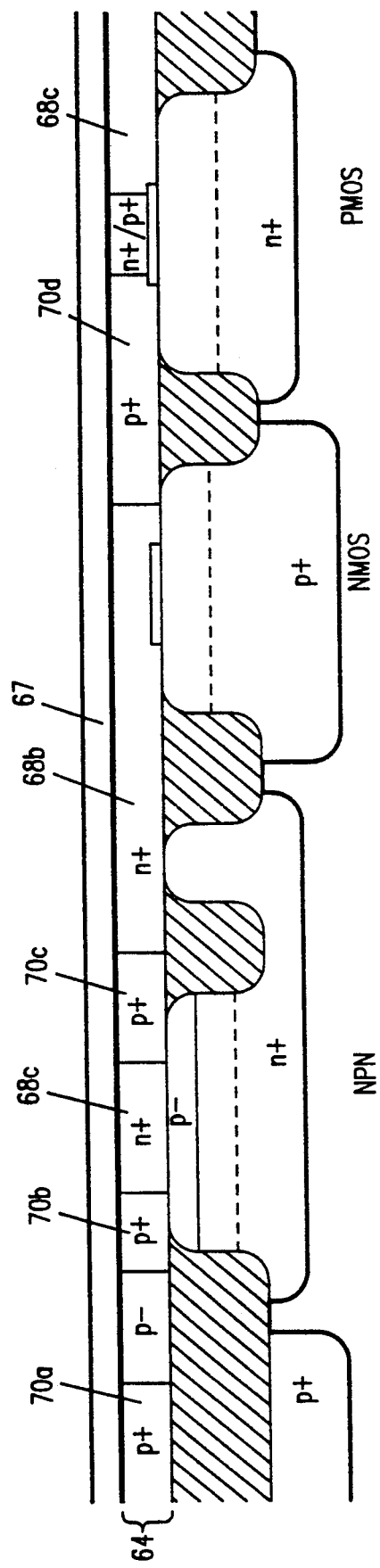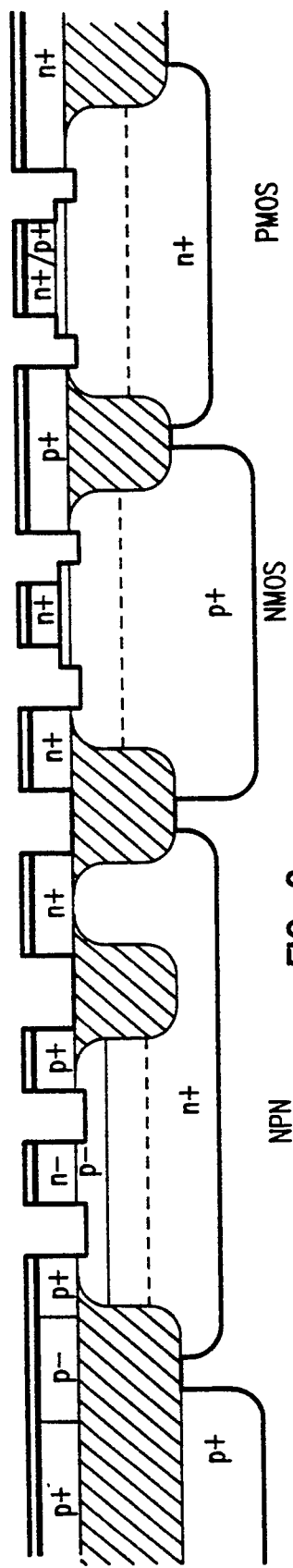

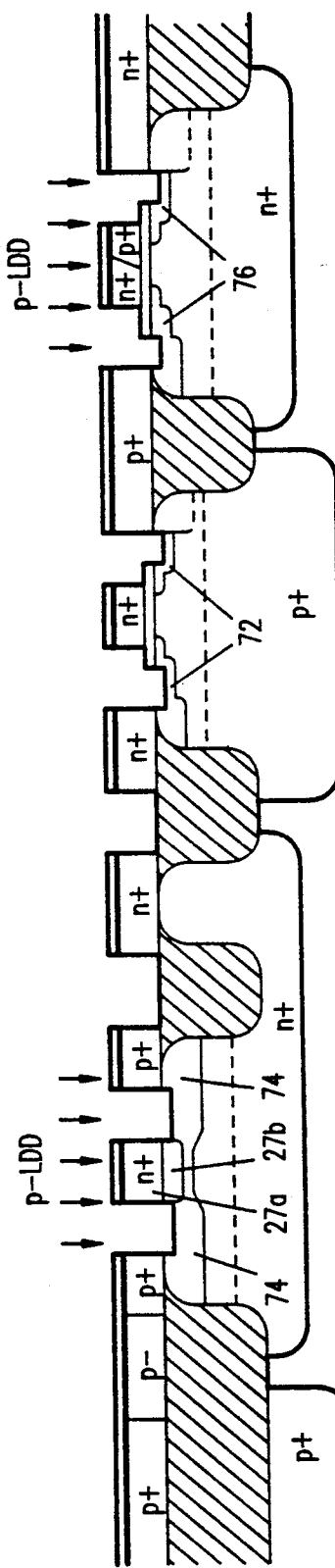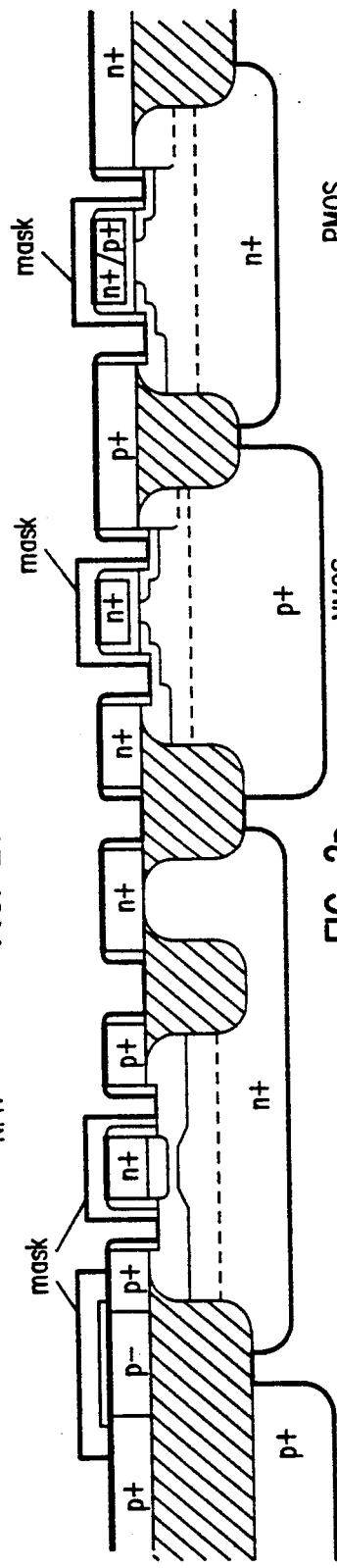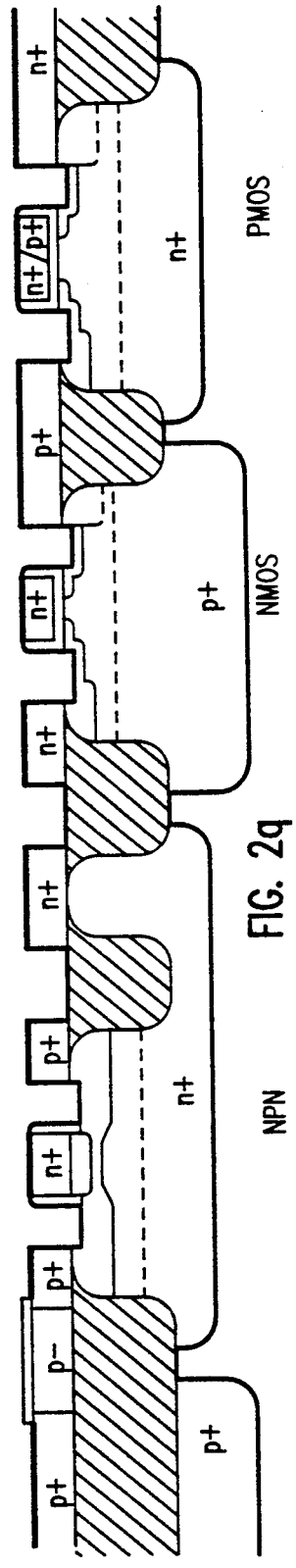

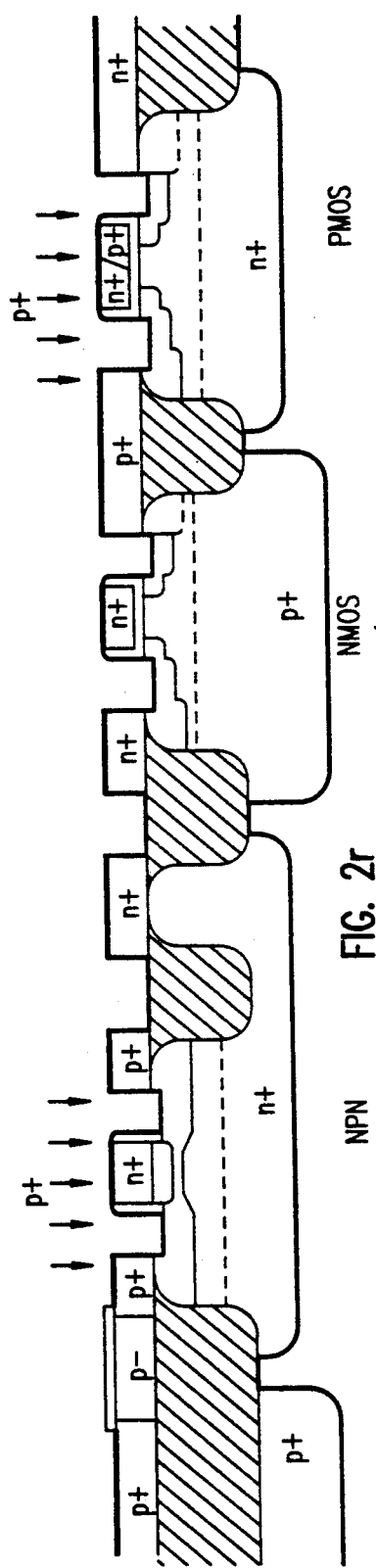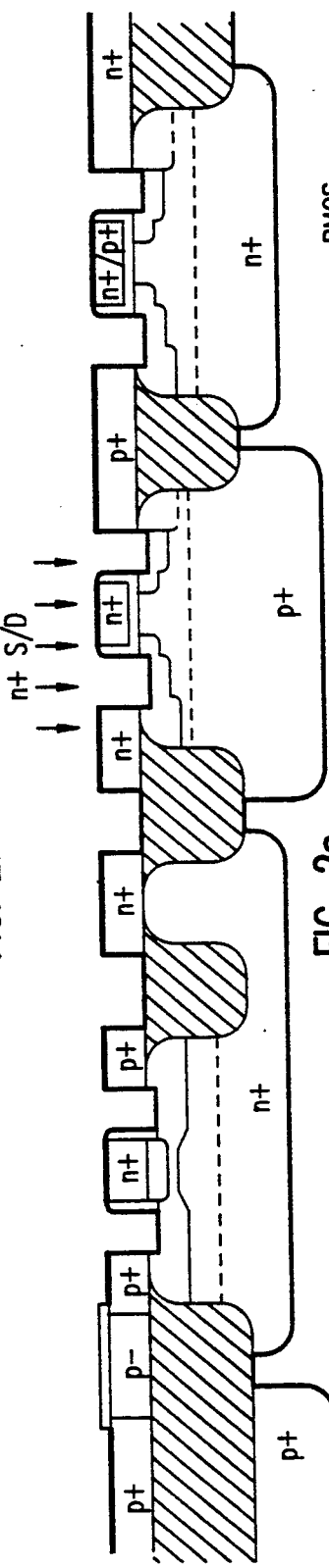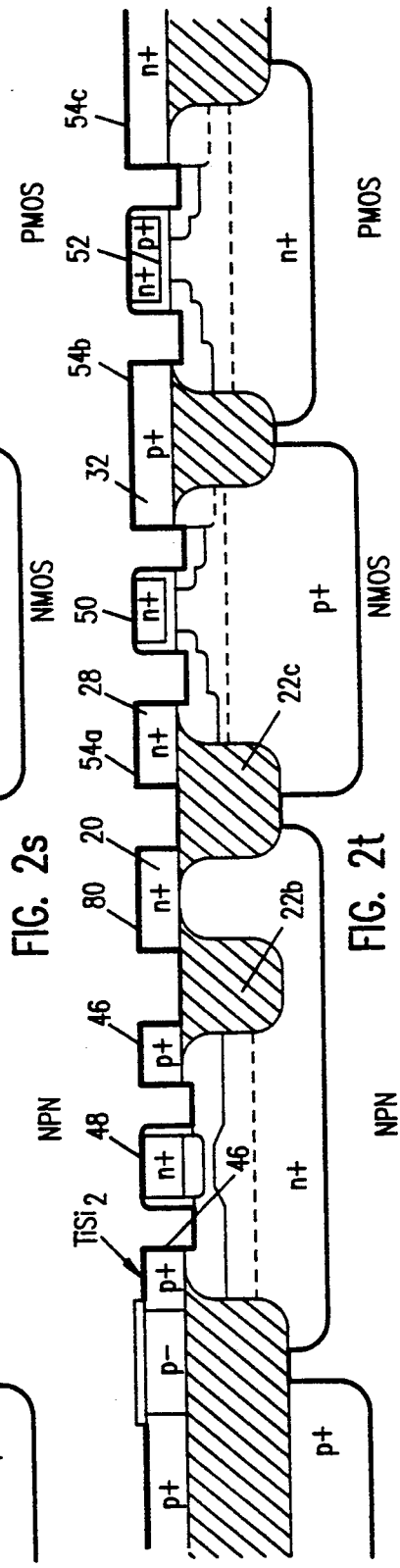

FORMATION OF SILICIDE CONTACTS USING A SIDEWALL OXIDE PROCESS

This is a division of application Ser. No. 503,336 filed Apr. 2, 1990, now U.S. Pat. No. 5,107,321.

BACKGROUND OF THE INVENTION

The present invention relates to the field of semiconductor devices and their manufacture. More specifically, in one embodiment the invention provides both bipolar and complementary metal-oxide semiconductor (CMOS) devices on a single substrate and a process for their fabrication.

Bipolar and CMOS devices and their fabrication have been well known for many years. Recently, the advantages of both types of devices have been beneficially incorporated into circuits using both types of devices on a single substrate. Circuits which incorporate both bipolar and CMOS devices have come to be known as "BiCMOS." BiCMOS devices offer the advantages of the high packing density and low power consumption of CMOS devices, as well as the high speed of bipolar devices. One BiCMOS device and process for fabrication thereof is described in U.S. Pat. No. 4,764,480 (Vora), assigned to the assignee of the present invention and incorporated herein by reference for all purposes.

While meeting with some success, BiCMOS devices continue to have certain limitations. For example, oxide encroachment in the isolation process reduces the packing density of the CMOS structures. Further, the isolation processes used in prior devices prevents close spacing of the transistors due to the associated reduction in latchup immunity. Still further, it has been necessary to provide a punchthrough implant in scaled MOS devices to prevent punchthrough. Still further, source/drain resistance and source/drain contact resistance has limited the current drive capability of the MOS transistors and the packing density of the CMOS structures has been limited by direct metal contacting of the source/drain regions. Also, capacitance of the source/drain junction limits the AC performance of the CMOS structures.

Extrinsic base resistance is in some instances an important factor in AC performance of bipolar structures. Still further, collector-substrate junction capacitance degrades the speed of bipolar circuits.

From the above it is seen that an improved BiCMOS device and method of fabrication thereof is desired not only to provide devices with improved performance and reduced size, but also to provide devices which can be fabricated more simply and economically.

SUMMARY OF THE INVENTION

An improved BiCMOS technology is disclosed. The invention provides devices which have improved performance, reduced size, and/or which may be fabricated more simply. The devices disclosed herein may be used with, for example, high performance Emitter Coupled Logic (ECL) standard cell designs, multiport 6 transistor memory cell, gate array designs with embedded memory, and the like.

According to one aspect of the invention, an improved method of forming gate oxide is provided. The method includes the steps of forming an insulator region on a surface of a semiconductor substrate; forming a first polysilicon layer on the insulator; forming a mask on portions of the polysilicon layer, the portions defining gate regions of the field effect devices; and removing the polysilicon and the insulator from the surface in regions not protected by the mask.

According to another aspect of the invention, an improved method of adjusting the threshold voltage in a BiCMOS process is provided. A first portion of the field effect devices has a channel region of a first conductivity type, and a second portion of the field effect devices has a channel region of a second conductivity type. The method includes the steps of, in a substrate having a surface with first and second regions, implanting a first dopant in the first regions, the first dopant of the first conductivity type; implanting the first and second regions with a second dopant, the second dopant of a second conductivity type, the first region having a net dopant concentration of the first conductivity type; forming gate oxide regions on the first and second regions; and forming conductive gates on the gate oxide regions, the first regions comprising the channel regions of a first conductivity type, the second regions comprising the channel regions of a second conductivity type.

The invention also provides a method of forming a base region in bipolar devices and a channel region in field effect devices in a BiCMOS process. The method forms a semiconductor structure comprising field effect devices and bipolar transistors, the bipolar transistors having base regions of a first conductivity type, at least a portion of the field effect devices having channel regions of the first conductivity type, and includes the steps of masking selected regions of the semiconductor structure, the selected regions including at least the base regions of the bipolar transistors; implanting the semiconductor structure with a dopant of the first conductivity type to provide the channel regions of the devices having first characteristics; forming a polysilicon layer over at least the base regions; masking second selected regions of the semiconductor structure, the second selected regions including at least the channel regions of the field effect devices; implanting the polysilicon layer with a dopant of the first conductivity type; and diffusing dopants from the polysilicon layer into underlying silicon to provide at least a portion of the base regions of the bipolar transistors with second characteristics.

An overall method of forming n and p channel field effect devices in a BiCMOS structure is also provided. The substrate includes a first region for a bipolar transistor, a second region for an NMOS transistor, and a third region for a PMOS transistor. The method includes the steps of in a p-type semiconductor substrate, masking and implanting n-type dopants for formation of an n-type buried layer for the PMOS and bipolar transistors; masking and implanting p-type dopants for formation of a p-type buried layer for the NMOS transistor and p-type channel stops adjacent the first region; forming an n-type epitaxial silicon layer on the substrate; forming field oxide regions adjacent the first, second and third regions, as well as between a sink and a base region of the first region; masking and implanting n-type dopants into the sink region to a first dopant concentration; masking and implanting n-type dopants into the third region to a second dopant concentration; masking and implanting p-type dopants into the second and third regions so as to adjust a threshold voltage of the NMOS and PMOS transistors; forming a gate oxide layer on the epitaxial layer; forming a first layer of polysilicon on the gate oxide layer; masking and etching the first layer of polysilicon and the oxide layer to form gate oxide regions for the NMOS and PMOS transistors; forming a second layer of polysilicon on the first layer of polysilicon and the epitaxial layer; masking and implanting n-type and p-type dopants into the second polysilicon layer and etching the polysilicon layer to form emitter, base, collector contacts for the bipolar transistor, source and drain contacts for the NMOS and PMOS transistors, and gate polysilicon regions for the NMOS and PMOS transistors; implanting n-type dopant to form a lightly doped diffusion in the NMOS transistor; masking and implanting boron to form a lightly doped diffusion for PMOS and bipolar transistors; forming sidewall oxide on the emitter, base, collector contacts of the bipolar transistor, the source and drain contacts of the NMOS and PMOS transistors, and the gate polysilicon regions of the NMOS and PMOS transistors; masking the sidewall oxide on the emitter contact and the gate polysilicon regions, and removing sidewall oxide from exposed regions; implanting p-type dopants into the first and third regions; implanting n-type dopants into the second regions; forming a refractory metal layer across at least the first, second and third regions and heating the substrate so as to form metal silicide where the refractory metal contacts silicon; removing unreacted metal from at least the first, second, and third regions; and forming an interconnect system for the NMOS, PMOS and bipolar transistors.

A further understanding of the nature and advantages of the inventions herein may be realized by reference to the remaining portions of the specification and the attached drawings.

DESCRIPTION OF THE PREFERRED EMBODIMENTS

CONTENTS

I. General
II. Fabrication Sequence of BiCMOS Devices
III. Device Performance

I. General

Figure 1:
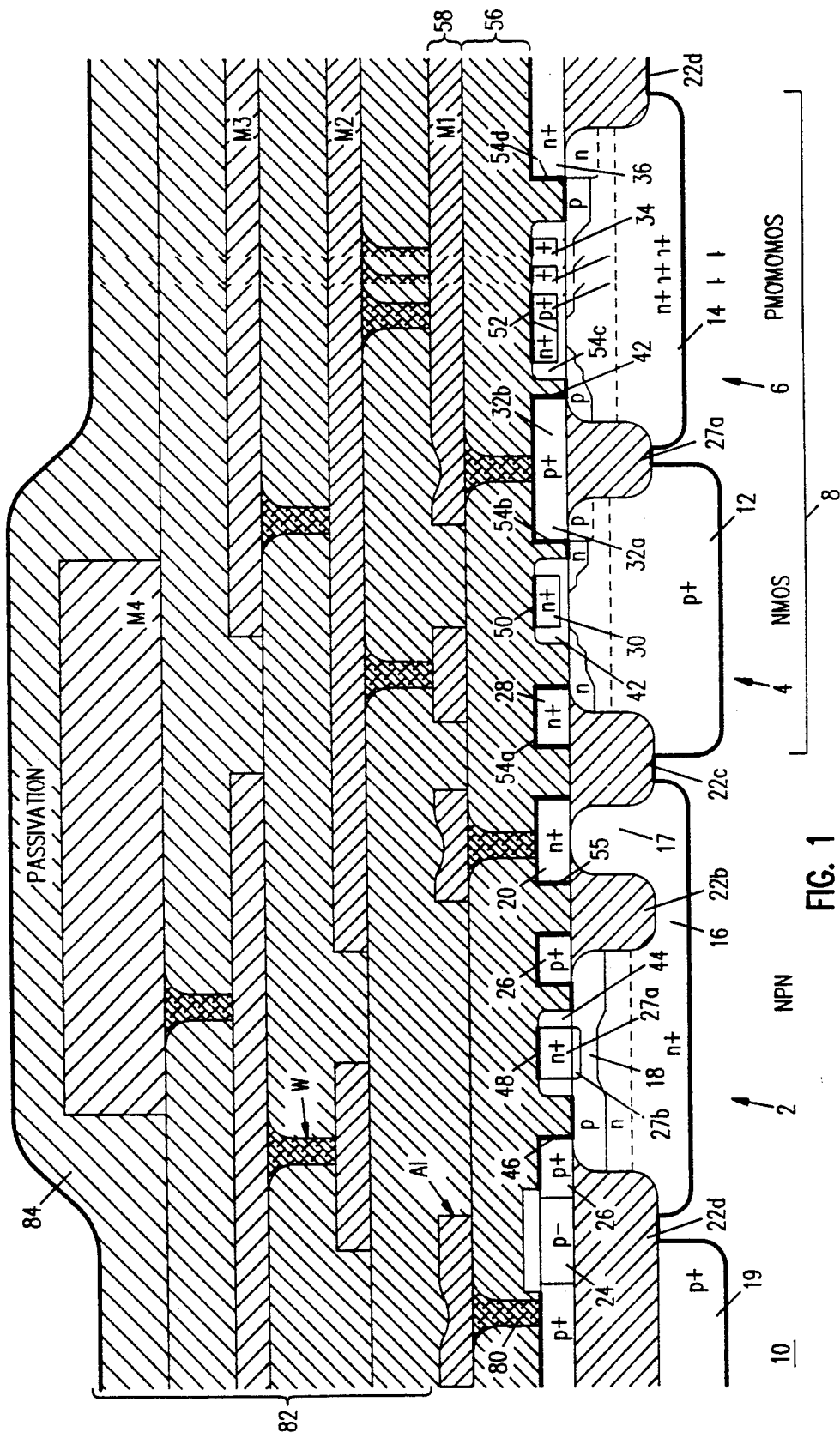
FIG. 1 is a cross-section of a BiCMOS structure according to one embodiment of the invention.

FIG. 1 illustrates a BiCMOS device in cross-section according to one embodiment of the invention. The device includes a bipolar transistor 2 (which in the embodiment shown in FIG. 1 is an NPN transistor), an n-channel MOSFET (NMOS transistor) 4 and a p-channel MOSFET (PMOS transistor) 6 in the same substrate. The NMOS transistor 4 and the PMOS transistor 6 are appropriately connected to form a CMOS structure 8.

The devices are fabricated on a substrate 10. In the embodiment shown in FIG. 1 the substrate is a p-substrate having a dopant concentration of between about $1 \times 10^{13}$ and $1 \times 10^{16}$ with a preferred range of $2 \times 10^{14}$ and $3 \times 10^{15}/cm^3$. A reduced pressure doped n-type epitaxial silicon is grown on top of the substrate, in which the devices are fabricated.

In most embodiments the NMOS transistor 4 is formed in a p+ tub or p well 12 and the PMOS transistor 6 is formed in an n+ tub or n well 14. In preferred embodiments the n well 14 is graded and doped to a concentration of between about $1 \times 10^{16}$ and $2 \times 10^{19}/cm^3$ with a preferred concentration of about $2 \times 10^{16}$ to $5 \times 10^{16}/cm^3$. The p well 12 is graded and doped to a general concentration of between about $1 \times 10^{16}$ to $1 \times 10^{18}$ with a preferred range of about $5 \times 10^{16}$ to $7 \times 10^{17}/cm^3$, although a wide range of dopant concentrations may be used without departing from the scope of the invention. Wells 12 and 14 enable the complementary conductivity devices to be formed on a single substrate.

The NPN transistor 2 is provided with a heavily doped buried layer 16 and collector sink 17, which together provide a low resistance connection region between a collector contact 20 and the base 18. In preferred embodiments the buried layer 16 and sink 17 are doped to a concentration or between about $1 \times 10^{17}$ and $1 \times 10^{20}$ with a preferred range of about $5 \times 10^{18}$ to $1 \times 10^{20}/cm^3$.

A p+ channel stop 19 is provided between the NPN transistor and adjacent devices to prevent surface inversion of the lightly doped substrate which would connect the buried layer 16 with adjacent devices. Between the NMOS transistor 4 and the PMOS transistor 6, between the sink 17 and the base 18, between the NPN and NMOS transistors, and between the transistors shown in FIG. 1 and adjacent transistors, oxide isolation regions 22a, 22b, 22c, and 22d, respectively, are provided which typically will be, for example, $SiO_2$ for device isolation.

Along the surface of the device and formed from a single layer of deposited polycrystalline silicon (polysilicon), are a resistor 24, base contact 26, emitter contact 27a, collector contact 20, NMOS drain contact 28, NMOS gate 30, NMOS source/well tap 32a, PMOS drain 32b, PMOS gate 34, and PMOS source/well tap contact 36. An emitter region 27b is diffused into the monocrystalline epitaxial layer from emitter contact 27a. It is to be recognized that while region 27a is referred to herein as the emitter contact, this region is sometimes referred to by those of skill in the art as an emitter. No difference in meaning is intended.

Thin gate oxide layers are provided beneath the NMOS and PMOS transistor gates, and sidewall oxide 42 is provided on the NMOS and PMOS gates. In preferred embodiments the NMOS gate is formed of heavily doped implanted n+ polysilicon, while the PMOS gate may be formed from n+ or p+ implanted polysilicon. N-type dopants are preferred in the PMOS gate because n+ will provide a buried channel device, having a higher carrier mobility, while p+ will provide a surface channel device. Sidewall oxide 44 is also provided on the sidewalls of the bipolar emitter 27.

Metallic contacts (i.e., contacts containing metal) such as silicide contacts 46 are formed on the p+ bipolar transistor base contacts 26. The silicide contact covers the upper portion of the base contact, the sidewall of the base contact, as well as the horizontal upper surface of the base region from the sidewall of the base contact up to the sidewall oxide of the emitter. A separate silicide contact 48 is provided along the top portion of the emitter 27 between the sidewall spacer oxide regions 44. The refractory metal contacts shown herein reduce the resistivity of the contacts and, therefore, increase the speed of the device.

Similarly, silicide contacts are provided for the poly collector contact 20, the NMOS gate 30, the PMOS gate 34, and p+/n+ source and drain polycrystalline contacts 28, 32, and 36. Like the contact for the emitter 27, the silicide contacts 50 and 52 for the NMOS and PMOS gates, respectively, extend only from sidewall oxide to sidewall oxide. Conversely, the silicide contacts 54a, 54b, 54c, and 54d for the NMOS and PMOS source and drain contacts cover the sidewall of the polysilicon contacts and extend along the horizontal portion of the source/drain up to the sidewall oxide of the gates 30 and 34. The silicide 55 for the collector contact covers the sidewalls of the contact down to field oxide regions 22b and 22c, as well as the upper surface of the collector contact.

The structure further includes a thick (0.8 to 1.3 and preferably about 1.3 μm) oxide layer 56 to insulate the devices from metal layer 58, used for interconnection purposes. Tungsten plugs 80 may optionally be provided to fill the apertures in the oxide layer 56 between the first metal layer and the various silicide regions. Additional metal/oxide interconnect layers 82 may also be provided, topped by a passivation layer 84.

II. Fabrication Sequence of BiCMOS Devices

Figure 2A:
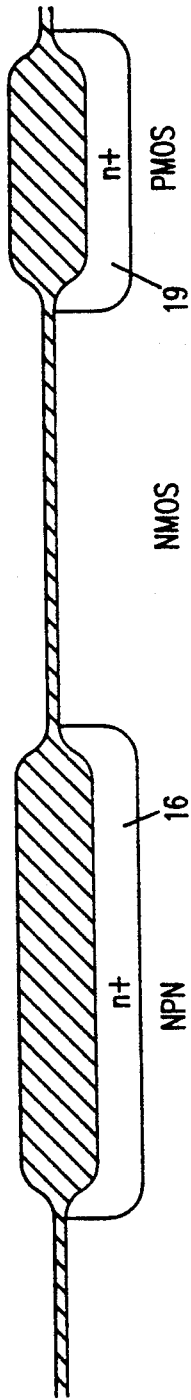
FIGS. 2a to 2v illustrate fabrication of a BiCMOS device.
Figure 2B:
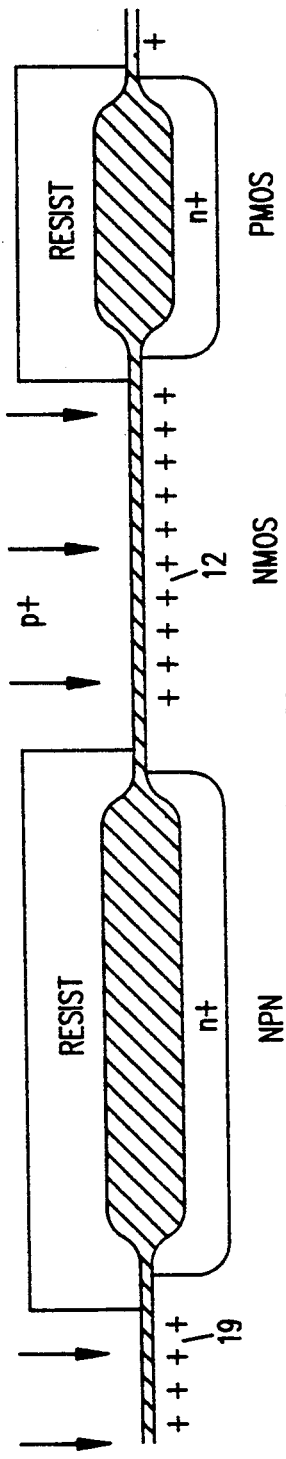
Figure 2C:
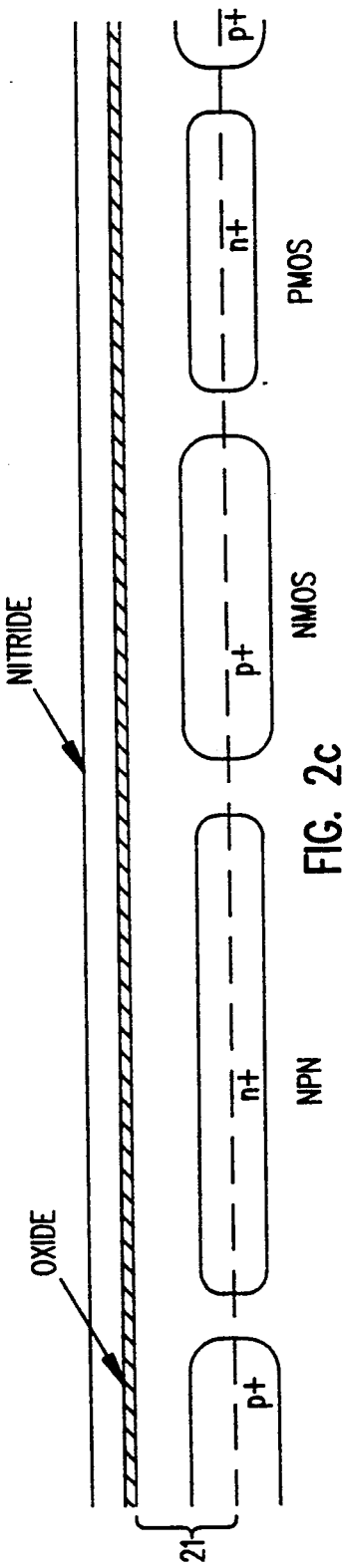
Figure 2U:
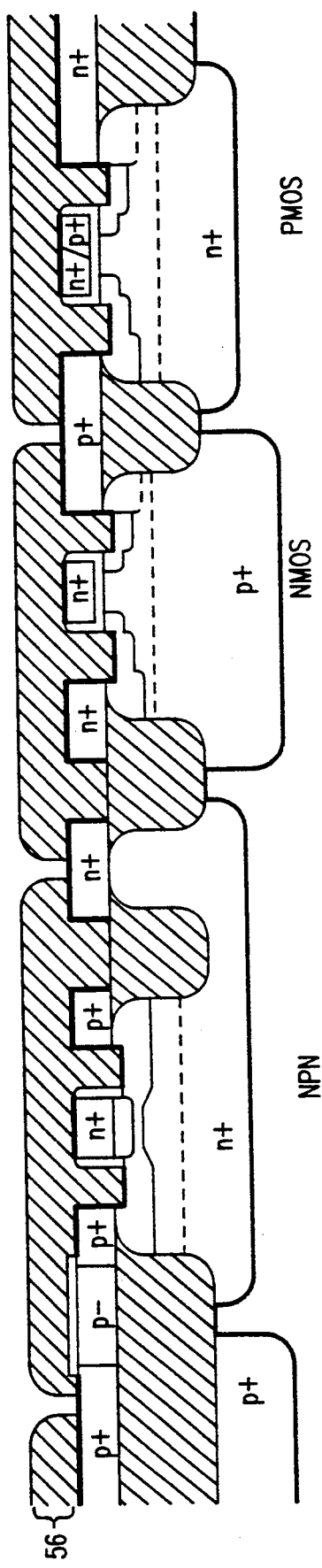
Figure 2V:
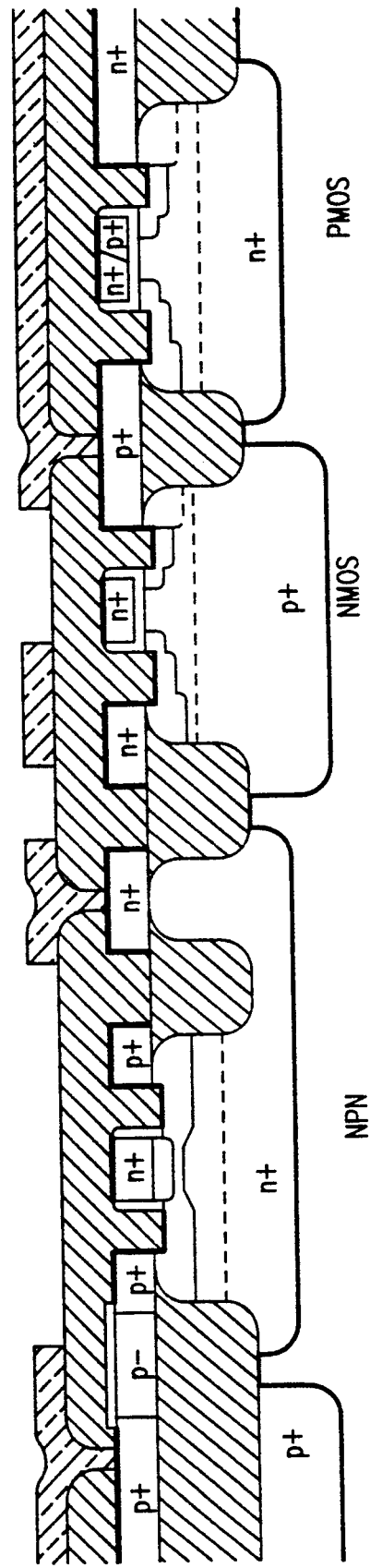

FIGS. 2a through 2v illustrate fabrication of the BiCMOS devices shown in FIG. 1. In particular, FIG. 2a illustrates a cross-section of the devices at a first stage of their fabrication. To reach this stage, the substrate was denuded, and a screen oxide layer was formed. The device was then masked for simultaneous implant of the n+ tub or well 14 and the npn buried layer 16 with arsenic, antimony, or the like. The implant energy used for formation of regions 14 and 16 is preferably about 50 to 200 keV with a preferred range of between about 60 to 80 keV such that the dopant concentration of regions 14 and 16 is between about $5 \times 10^{17}$ to $2 \times 10^{20}$ with a preferred range of about $1 \times 10^{19}$ and $1 \times 10^{20}$/cm$^3$. The buried layers are then annealed and further oxidized. As shown, oxide will grow somewhat thicker over the n+ regions.

After formation of the n+ regions 14 and 16, the device is then masked as shown in FIG. 2b for simultaneous formation of the p+ channel stop 19 and the NMOS tub or well 12. The implant energy used in formation of the regions 19 and 12 is preferably between about 50 to 200 keV with a preferred range of 140 to 200 keV such that the dopant concentration of the p+ buried layers is between about $1 \times 10^{17}$ and $1 \times 10^{18}$/cm$^3$. The p+ regions preferably are doped with boron.

As shown in FIG. 2c, the channel stop mask and oxide are then removed and a doped n-type epitaxial silicon layer 21 having a thickness of, for example, about 1.1 μm is grown across the surface of the substrate. After depositing sandwiched layers of thermal oxide and nitride, a photoresist mask is then formed over the surface so as to expose the epitaxial silicon where oxide regions 22a, 22b, 22c, and 22d are to be formed and protect the active regions of the device. The oxide regions are formed using the well known "SWAMI" process according to one embodiment. The process may be modified by changing the silicon etch procedure and depth, and by choosing different oxide/nitride/oxide sidewall layers.

In particular, according to one embodiment, the silicon is masked and etched to a depth of, e.g., about 3000 Å using a plasma etch as shown in FIG. 2d. The resist is then removed and a second thermal oxide layer (of about 400 Å), a second nitride layer (of about 600 Å), and a third deposited oxide layer (of about 1800 Å) are formed on the device. A second plasma etch is used to remove about 750 Å of additional silicon leaving the device substantially as shown in FIG. 2e. The remaining sidewall oxide is then removed and the substrate is then oxidized in a high pressure (e.g., 10 atmospheres) oxidation environment to grow the necessary field oxide, leaving the device as shown in FIG. 2f.

Thereafter, the nitride is stripped and a grown screen oxide layer having a thickness of about 250 Å is formed on the surface of the substrate as shown in FIG. 2g. A mask is then formed, exposing only the sink region 17. As shown in FIG. 2h, a sink implant using an implant energy of about 100 to 190 keV with a dose of between about $1 \times 10^{14}$ and $1 \times 10^{16}$ using phosphorus as a dopant is then performed. The resulting dopant concentration in the sink region 17 is between about $1 \times 10^{18}$ and $1 \times 10^{20}$/cm$^3$. The sink mask is then removed and a separate mask/ion implantation is performed to dope the well and channel regions of the PMOS transistor to a concentration of between about $1 \times 10^{16}$ and $5 \times 10^{16}$/cm$^3$ using phosphorus as a dopant, also as shown in FIG. 2h. In preferred embodiments the implant energy used for the PMOS well region is between about 50 and 200 keV with energy of between about 100 and 200 keV preferred. The resulting net dopant concentration in the epitaxial channel region of the n-well is between about $1 \times 10^{16}$ and $5 \times 10^{16}$/cm$^3$. The sink and n-well are then annealed and driven-in by heating with a conventional thermal cycle in nitrogen.

Thereafter, a mask is formed on the surface of the substrate which exposes only the NMOS and PMOS transistor regions. This mask is used for a threshold voltage implant as shown in FIG. 2i. The implant is used to adjust the threshold voltage of the NMOS and PMOS transistors as necessary, typically to between about |0.6| and |1.0| volts. In preferred embodiments the threshold voltage implant is an implant of boron at a dose of between about $1 \times 10^{13}$ to $5 \times 10^{13}$ and preferably at 30 to 60 KeV. The boron and the up-diffusing p+ from the p-well set the threshold voltage for the NMOS transistor. The threshold voltage implant in conjunction with the n-well implant sets the PMOS threshold voltage. In preferred embodiments the threshold voltage implant ultimately provides transistors with threshold voltages of 0.75±0.1 for NMOS and −0.85±0.1 for PMOS transistors.

Referring to FIG. 2j, the screen oxide then is stripped and a thin (on the order of 135 to 165 Å) gate oxide layer 86 is grown using means well known to those of skill in the art. A thin (on the order of 400 to 600 Å) layer of polysilicon 88 is then deposited on the thin gate oxide layer and a mask 62 is formed on the poly layer to define the NMOS and PMOS gates. A plasma etch removes the undesired poly from all regions of the substrate except those over the NMOS and PMOS gate oxide regions. Next, a wet etch is used to remove the underlying oxide. Protection of the gate oxide by the thin poly layer provides MOS gates having far fewer defects since they are not exposed directly to photoresist.

FIG. 2k illustrates the next sequence of process steps. The gate oxide mask is removed and another layer of intrinsic polysilicon 64 having a thickness of about 1,000 to 4,000 and preferably about 3,200 Å is deposited across the entire surface of the substrate and a cap oxide layer 66 is formed by thermal oxidation of the polysilicon layer 64. The devices are then masked with photoresist to expose at least the base region of the bipolar transistor and the lightly doped regions of the resistors. In some embodiments, only the NMOS and PMOS transistor regions are protected by the mask. A base implant is then performed as shown in FIG. 21 and the base is annealed. In preferred embodiments the base implant uses an energy of between about 30 and 100 keV, with an implant energy of between about 30 and 50 preferred. The dose of this implant is preferably about $3 \times 10^{13}$ and $8 \times 10^{15}$. In preferred embodiments the anneal is performed by heating the structure to 900°–950° C. for 30–60 minutes, and results in a p- base region having a thickness of between about 1,000 and 2,000 Å with a dopant concentration of between about $1 \times 10^{18}$ and $1 \times 10^{19}$/cm$^3$, with a dopant concentration of about $5 \times 10^{18}$/cm$^3$ preferred.

Thereafter, as illustrated in FIG. 2m, a mask is formed which exposes regions 70a, 70b, 70c, and 70d which will eventually be a portion of the resistor, the base contacts, and the contact 32. The regions are preferably doped p+ to a concentration of between about $1 \times 10^{19}$ and $1 \times 10^{20}$/cm$^3$ with a dopant concentration of about $6 \times 10^{19}$/cm$^3$ preferred using boron. The p+ mask is removed and another mask is formed on the surface of the device to expose regions 68a, 68b, and 68c which will eventually be used as the bipolar emitter, the bipolar collector contact, the source/drain contacts, and the gates of the MOS transistors. The regions 68 are doped n+ using an arsenic implant with an energy of about 100 keV to a concentration of between about $5 \times 10^{19}$ and $1 \times 10^{20}$/cm$^3$. As discussed above, the PMOS gate may be either n+ or p+ and thus may be included in either the n+ or p+ mask. A layer of nitride 67 having a thickness of between about 1,000 and 1,200 Å is then deposited for the purpose of preventing etch undercutting of the underlying polysilicon, and preventing the link implant from going into gates and emitters. The polysilicon layer 64 is then annealed at 900° C. for a time of about 15 minutes.

Next, a mask is formed on the surface of the nitride to protect the base, emitter, and collector contacts of the bipolar transistors and the source, gate, and drains of the NMOS and PMOS transistors. A dry etch with chlorine chemistry results in the structure shown in FIG. 2n. As shown, the etch is conducted such that the bipolar base and the epitaxial region adjacent the gates of the MOSFETs are etched below the original epitaxial surface by about 1,000 to 2,000 Å.

The next sequence of steps is illustrated in FIG. 2o. The etch mask is removed. A lightly doped drain (LDD) implant is performed in which the source and the drain of the NMOS transistor are lightly implanted with an n-type dopant such as phosphorus using an implant energy of between about 20 and 50 keV with implant energies of between about 20 and 40 keV preferred. This implant results in source and drain regions 72 which are self-aligned to the NMOS gate with a dopant concentration of about $5 \times 10^{17}$ and $1 \times 10^{19}$/cm$^3$. After an oxidation step to grow a cap oxide, a p-type LDD using a dopant such as BF$_2$ is performed across the surface of the bipolar transistor and the PMOS transistor with the source and drain of the PMOS transistor and the base region of the bipolar transistor exposed by a mask. A more heavily doped p-region 74 which is self-aligned to the emitter is formed in the base of the bipolar transistor and a more heavily doped p-region 76 which is self-aligned to the gate is formed around the gate of the PMOS transistor. The resulting net dopant concentration in the regions 74 and 76 is between about $5 \times 10^{17}$ and $1 \times 10^{19}$/cm$^3$. The implant energy is preferably between about 40 and 60 keV. As shown, more heavily doped well ties are also diffused from the NMOS and PMOS contacts. Also, an emitter region 27b is diffused from the overlying emitter contact 27a and heavily doped extrinsic base regions are diffused from the base contact.

Referring to FIG. 2p, nitride is stripped from the surface of the device and a Low Temperature Oxide (LTO) deposition is performed. A silicide exclusion mask, not shown, is formed on the device on polysilicon regions where silicide formation is not desired (e.g., over the center portion of the resistor). The oxide is then etched back, leaving spacer oxide on exposed sides of the source contacts, drain contacts, gates, emitters, base contacts, and collector contacts using means known to those of skill in the art. The mask shown in FIG. 2p is then formed over the device for protection of at least the sidewall oxide on the bipolar emitter, the gates of the NMOS and PMOS transistors, and the resistor. The device is etched with BOE for about 1 minute and, as shown in FIG. 2q, the oxide is removed from the sidewall of the resistor/base contacts, the collector contacts, and the source and drain contacts of the NMOS and PMOS transistors. In alternative embodiments, sidewall oxide is selectively formed on the sidewall of polysilicon according to the process disclosed in U.S. application Ser. No. 07/503,491 which is incorporated herein by reference for all purposes.

Referring to FIG. 2r, a mask is formed and a heavy p+ (BF$_2$) implant is performed in the regions shown therein, i.e., in the region of the source/drain of the PMOS transistor and the extrinsic base region of the bipolar transistor. The purpose of this implant is to further lower the resistances of the source/drain and extrinsic base regions. The implant uses an energy of between about 40 and 60 keV. Similarly, as shown in FIG. 2s, an n+ (arsenic) implant is performed in the region of the source/drain of the NMOS transistor for the purpose of forming the source/drain regions and lowering their resistances. The arsenic implant uses an energy of between about 50 and 100 keV. The device is then, optionally, annealed at a temperature of about 900° to 950° C. for about 10 to 30 minutes or at a temperature of 1000° to 1100° C. for about 10 to 30 seconds using a rapid thermal annealing process.

Next, a layer of refractory metal such as titanium, molybdenum, tantalum, tungsten, or the like, is deposited across the surface of the device. Using means well known to those of skill in the art, the layer is heated to form metal silicide in regions where the deposited metal is in contact with polysilicon. Remaining unreacted metal is then etched away from the device, leaving a structure as shown in FIG. 2t. As shown therein, the bipolar polysilicon base contacts are covered with silicide 46 across their horizontal upper surfaces, and along their vertical sidewalls. In addition, the silicide contacts extend from the vertical sidewalls along the horizontal upper surface of the single-crystal base fully up to the sidewall oxide of the emitter. The silicide contact 48 of the emitter extends across the horizontal upper surface of the emitter contact from one sidewall oxide to the opposite sidewall oxide. The silicide 80 on the collector contact 20 extends up both vertical sidewalls of the collector contact and fully across the horizontal upper surface of the contact, terminating on the field oxide regions 22b and 22c. The silicide 54a on the NMOS polysilicon contact 28 extends from the field oxide region 22c, up the vertical sidewall of the contact, across its upper surface, and down the vertical portion of the contact to the single-crystal source region of the NMOS transistor. Additionally, the silicide extends from the contact across the horizontal upper portion of the source/drain regions to the gate sidewall oxide. Like the bipolar emitter, the polysilicon gate of the NMOS transistor includes silicide 50 across its upper surface which extends from one oxide sidewall to the opposite sidewall oxide.

The polysilicon well tap 32 also is covered with silicide which covers both the vertical sidewalls and horizontal upper surface of the contact. Additionally, the silicide extends across the upper surface of the transistors up to the sidewall oxide of the transistor gates. The PMOS gate includes silicide 52 across its horizontal upper surface, while the PMOS source contact includes silicide 54c across its horizontal upper surface, its vertical sidewall, and across the horizontal surface of the drain up to the gate sidewall oxide.

The contact scheme disclosed herein provides reduced source/drain resistance through silicidation of the sidewall polysilicon contact strap, thereby increasing the current drive capability of the CMOS transistors and eliminating the polysilicon-silicon contact resistance. Reduced polysilicon source/drain to the epitaxial silicon source/drain overlap is obtained by removing the sidewall spacer oxide and silicidation of this sidewall, since the current will be carried through this sidewall silicide and not through the epitaxial silicon-polysilicon interface. This provides for a higher packing density through smaller CMOS transistor active areas.

Removal of the spacer sidewall oxide and silicidation of the extrinsic base polysilicon sidewall will lower the extrinsic base resistance, thus eliminating the problem with the high polysilicon-silicon contact resistance, which enhances the bipolar transistor electrical characteristics. The bipolar transistor geometry is reduced by siliciding the sidewall extrinsic base poly and through reduction of the base polysilicon to the epitaxial silicon base overlap; consequently, a lower extrinsic base junction capacitance is obtained in conjunction with a lower extrinsic base resistance. Also, the reduction in the bipolar transistor active area due to the sidewall silicidation also reduces the collector-substrate junction capacitance, thereby enhancing the transistor electrical characteristics. Still further, siliciding of the collector sidewall poly for contacting the silicided polysilicon to the silicided silicon collector will reduce the collector resistance by eliminating the polysilicon to silicon contact resistance. This lower resistance will allow for scaling of the collector area, and thus a reduction in the collector-substrate capacitance and an increase in the packing density.

It is believed that sidewall silicidation of the local interconnects improves the resistance of the interconnect by a factor of 2, thereby enchancing the circuit performance. Silicided polysilicon according to the invention herein, as applied to a ground top, would reduce the ground tap resistance by conducting the current through the silicided sidewall poly tap to the substrate rather than the doped polysilicon to the substrate.

FIG. 2u illustrates the next step in the fabrication sequence in which oxide layer 56 is deposited and masked to form contact holes therein. Metal is deposited on the surface of the device, masked, and etched from selected regions, providing the device shown in FIG. 2v. In alternative embodiments the contact holes are filled with tungsten and etched back so as to form a planar surface before deposition of the metal interconnect layer. Thereafter, additional metallization layers are formed and the device is passivated, providing the structure shown in FIG. 1.

III. Device Performance

Table 1 summarizes the electrical parameters of devices fabricated according to one embodiments of the invention above. Table 1 illustrates the target CMOS and bipolar electrical characteristics according to one embodiment of the invention.

TABLE 1

| BiCMOS Transistor Parameters | |
|---|---|
| CMOS: | |
| Gate oxide thickness [Å] | 150 ± 15 |
| $L_{eff}$(n-chanel) [μm] | 0.7 ± 0.15 |
| $L_{eff}$(p-channel) [μm] | 0.7 ± 0.15 |
| Minimum p- and n- gate length | 0.8 |
| n-threshold voltage [V] | 0.75 ±0.1 |
| p-threshold voltage [V] | −0.85 ± 0.1 |
| n-channel $I_{dsat}$ [mA/μm] | >0.38 |
| p-channel $I_{dsat}$ [mA/μm] | >0.17 |
| $I_{sub}$ (i.e., substrate current) [μA/μm] | 1 ± 20% |
| NPN: | |
| Minimum emitter width [μm] | 0.8 |
| Device area [μm$^2$] | 1.6 × 6.1 |
| Current gain | 90 |
| E-B breakdown [V] | 6 |
| C-B breakdown [V] | 16 |
| C-E breakdown [V] | 8 |

Figure 3:
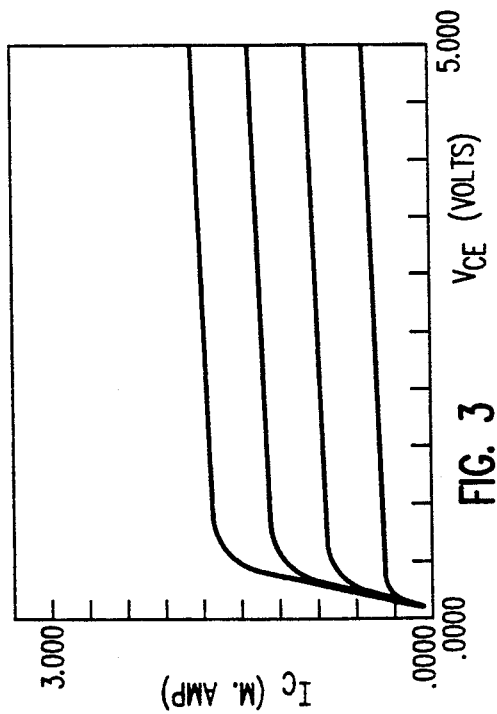
FIG. 3 illustrates $I_c$ versus $V_{ce}$ for a bipolar transistor according to one embodiment of the invention.

FIG. 3 illustrates a typical $I_c$ versus $V_{ce}$ curve for a bipolar transistor fabricated according to one embodiment of the invention. FIG. 3 shows that the devices have a high Early voltage.

Figure 4B:
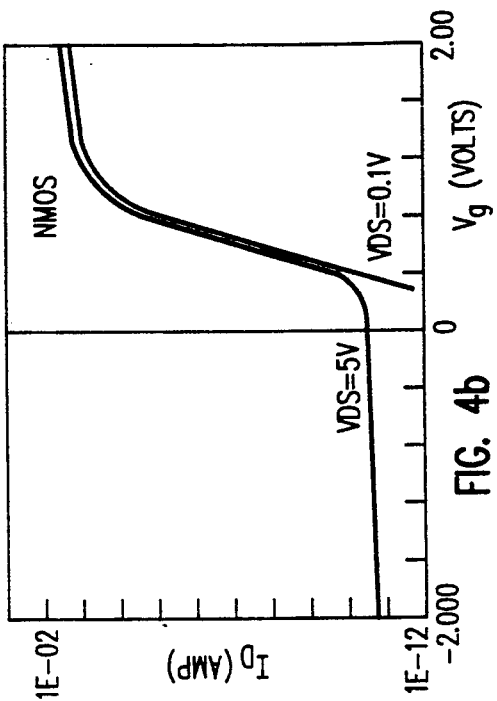
FIGS. 4a and 4b illustrate $I_d$ versus $V_{gs}$ for PMOS and NMOS transistors respectively.
Figure 4A:
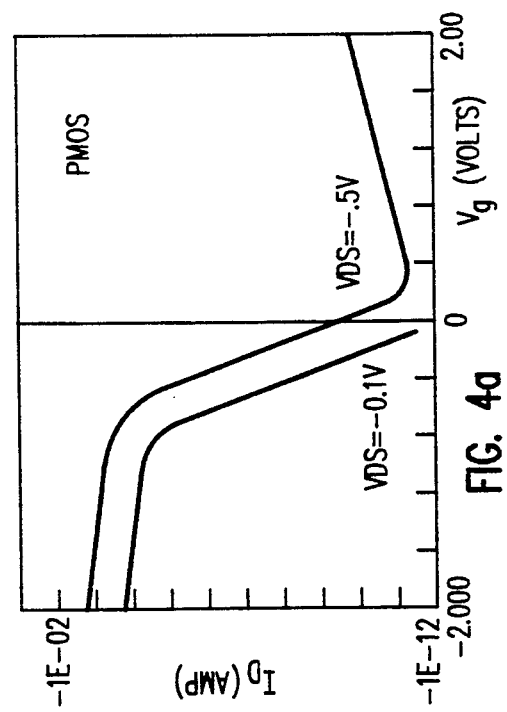

FIGS. 4a and 4b are subthreshold slopes for 40/0.8 (i.e., width=40 μm, length=0.8 μm) PMOS and NMOS transistors, respectively, for drain volatges of 0.1 and 5 volts. The transistors have off to on current ratios of better than 6 decades, with leakage currents in the pA range for $V_{ds}=\pm 5$ v.

Figure 5:
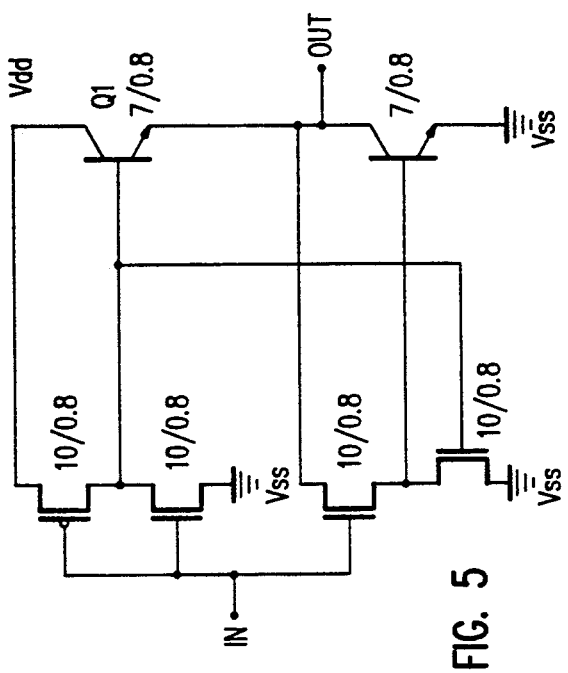
FIG. 5 illustrates a BiCMOS ring oscillator used in testing one embodiment of the invention.

Table 2 provides actual gate delays for loaded and unloaded CMOS, BiCMOS, and ECL devices fabricated according to one embodiment of the invention. FIG. 5 illustrates the BiCMOS ring cell used to develop the data shown in Table 2. Table 2 illustrates that devices fabricated according to the inventions herein provide high performance CMOS devices.

TABLE 2

| Ring Oscillator Delays (picoseconds) | | |
|---|---|---|
| | No Load | 1 pF Load |
| CMOS | 83 | ~500 |
| BiCMOS | 120 | ~400 |
| ECL | <50 | ~80 |

It is to be understood that the above description is intended to be illustrative and not restrictive. Many variations of the invention will become apparent to those of skill in the art upon review of this disclosure. Merely by way of example particular regions of the devices shown herein have been illustrated as being p-type or n-type, but it will be apparent to those of skill in the art that the role of n- and p-type dopants may readily be reversed. Further, while the invention has been illustrated with regard to specific dopant concentrations in some instances, it should also be clear that a wide range of dopant concentrations may be used for many features of the devices herein without departing from the scope of the inventions herein. Still further, while the inventions herein have been illustrated primarily in relation to a BiCMOS device, many facets of the invention could be applied in the fabrication of bipolar transistors, MOSFETs, or other devices in isolation. The scope of the invention should, therefore, be determined not with reference to the above description, but instead should be determined with reference to the appended claims along with their full scope of equivalents.

What is claimed is:

1. A method of making a contact structure in a semiconductor device, the semiconductor device comprising a substrate, a first polysilicon region on the substrate, and a second polysilicon region on the substrate, comprising the steps of:
    a) forming oxide sidewalls on said first and said second polysilicon regions;
    b) protecting at least one sidewall of said first polysilicon region, said at least one sidewall between said first polysilicon region on said substrate and said second polysilicon region on said substrate;
    c) removing unprotected sidewall oxide to leave oxide remaining on said at least one sidewall;
    d) forming a metal layer on an upper surface of said semiconductor device and said first and second polysilicon regions;
    e) heating said metal layer so as to form metal silicide where said metal is in contact with silicon; and
    f) removing unreacted metal so as to leave a silicide contact extending over at least an upper surface of said second polysilicon region and a first sidewall of said second polysilicon region.

2. The method as recited in claim 1 wherein said step of removing also leaves silicide on said substrate between said first sidewall of said second polysilicon region and said oxide remaining on said at least one sidewall.

3. The method as recited in claim 1 wherein the step of protecting is a step of forming a mask.

4. The method as recited in claim 1 preceded by the step of forming an oxide region between said first polysilicon region and said substrate, said first polysilicon region, said oxide region between said first polysilicon region and said substrate, and said substrate forming a metal, insulator, semiconductor device.

5. The method as recited in claim 2 further comprising the step of doping said substrate between said first sidewall of said second polysilicon region and said oxide remaining on said at least one sidewall to a first conductivity type, said substrate below said oxide region between said first polysilicon region and said substrate comprising monocrystalline silicon of a second conductivity type.

6. The method as recited in claim 2 further comprising the step of providing said substrate below said first polysilicon region with a dopant of a first conductivity type, said first polysilicon region comprising monocrystalline silicon of a second conductivity type.

* * * * *